United States Patent
Ricotti et al.

(10) Patent No.: US 9,618,532 B2
(45) Date of Patent: Apr. 11, 2017

(54) MAGNETIC INERTIAL SENSOR AND METHOD FOR OPERATING THE SAME

(71) Applicant: STMICROELECTRONICS S.R.L., Agrate Brianza (IT)

(72) Inventors: Giulio Ricotti, Broni (IT); Alberto Pagani, Nova Milanese (IT); Fulvio Vittorio Fontana, Monza (IT); Ubaldo Mastromatteo, Bareggio (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/081,507

(22) Filed: Mar. 25, 2016

(65) Prior Publication Data
US 2016/0209440 A1 Jul. 21, 2016

Related U.S. Application Data

(63) Continuation of application No. 13/854,782, filed on Apr. 1, 2013, now Pat. No. 9,322,839.

(30) Foreign Application Priority Data

Apr. 2, 2012 (IT) .............................. TO2012A0290

(51) Int. Cl.
*G01P 15/11* (2006.01)
*G01P 15/105* (2006.01)
(Continued)

(52) U.S. Cl.
CPC .............. *G01P 15/11* (2013.01); *B81B 7/008* (2013.01); *B81C 1/0023* (2013.01);
(Continued)

(58) Field of Classification Search
CPC ..... G01P 15/0802; G01P 15/105; G01P 15/11
(Continued)

(56) References Cited

U.S. PATENT DOCUMENTS 6,131,457 A    10/2000    Sato
6,262,463 B1    7/2001    Miu et al.
(Continued)

FOREIGN PATENT DOCUMENTS

WO    03/065075 A2    8/2003

OTHER PUBLICATIONS

Beeby et al., "Energy harvesting vibration sources for microsystems applications," Institute of Physics Publishing, Meas. Sci. Technol. 17 (2006), R175-R195, published Oct. 26, 2006, 21 pages.
(Continued)

*Primary Examiner* — John Chapman, Jr.
(74) *Attorney, Agent, or Firm* — Seed Intellectual Property Law Group LLP

(57) ABSTRACT

An inertial sensor having a body with an excitation coil and a first sensing coil extending along a first axis. A suspended mass includes a magnetic-field concentrator, in a position corresponding to the excitation coil, and configured for displacing by inertia in a plane along the first axis. A supply and sensing circuit is electrically coupled to the excitation coil and to the first sensing coil, and is configured for generating a time-variable flow of electric current that flows in the excitation coil so as to generate a magnetic field that interacts with the magnetic-field concentrator to induce a voltage/current in the sensing coil. The integrated circuit is configured for measuring a value of the voltage/current induced in the first sensing coil so as to detect a quantity associated to the displacement of the suspended mass along the first axis.

20 Claims, 11 Drawing Sheets

(51) Int. Cl.
*G01P 15/08* (2006.01)
*B81B 7/00* (2006.01)
*B81C 1/00* (2006.01)
*G01C 19/5783* (2012.01)
*G01P 15/097* (2006.01)

(52) U.S. Cl.
CPC ...... *G01C 19/5783* (2013.01); *G01P 15/0802* (2013.01); *G01P 15/097* (2013.01); *G01P 15/105* (2013.01); *B81B 2201/025* (2013.01); *B81B 2207/012* (2013.01)

(58) Field of Classification Search
USPC ...................................................... 73/514.31
See application file for complete search history.

(56) References Cited

U.S. PATENT DOCUMENTS

| | | | |
|---|---|---|---|
| 6,404,192 | B1 | 6/2002 | Chiesi et al. |
| 7,501,302 | B2 | 3/2009 | Kvisterøy |
| 7,886,595 | B2* | 2/2011 | Fischer .................. G01C 21/16 73/493 |
| 2010/0187835 | A1 | 7/2010 | Hohlfeld et al. |
| 2011/0140458 | A1 | 6/2011 | Arnold et al. |
| 2011/0210722 | A1 | 9/2011 | Paci et al. |

OTHER PUBLICATIONS

Lueke et al., "MEMS-Based Power Generation Techniques for Implantable Biosensing Applications," Department of Mechanical Engineering, University of Alberta, Canada, *Sensors* 2011, 11, 1433-1460, published Jan. 26, 2011, 28 pages.

Mitcheson et al., "Performance limits of the three MEMS inertial energy generator transduction types," Journal of Micromechanics and Microengineering, 17 (2007) S211-S216, published Aug. 31, 2007, 6 pages.

Pérez-Rodríquez et al., "Electromagnetic Inertial Generator for Vibrational Energy Scavenging Compatible With Si Technology," The Fifth International Workshop on Micro and Nanotechnology for Power Generation and Energy Conversion Applications, PowerMEMS 2005, Nov. 28-30, 2005, Takeda Hall, The University of Tokyo, Tokyo, Japan, 4 pages.

Wang et al., "A Microelectroplated Magnetic Vibration Energy Scavenger for Wireless Sensor Microsystems," IEEE International Conference on Nano/Micro Engineered and Molecular Systems, Jan. 20-23, 2010, Xiamen, China, 4 pages.

* cited by examiner

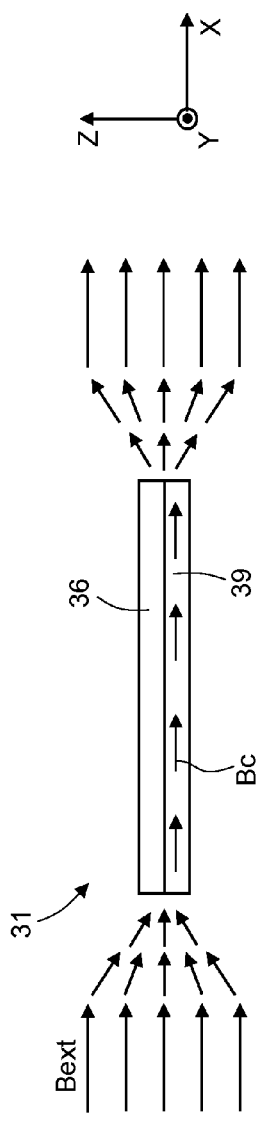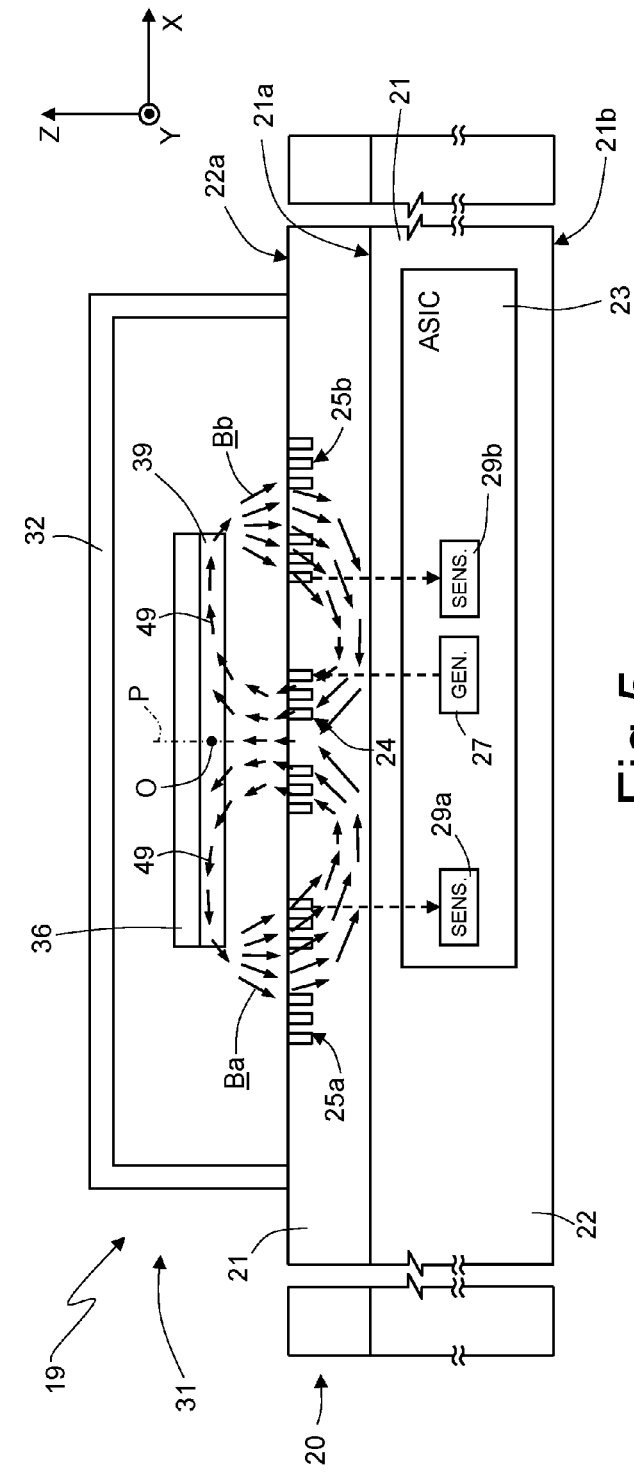

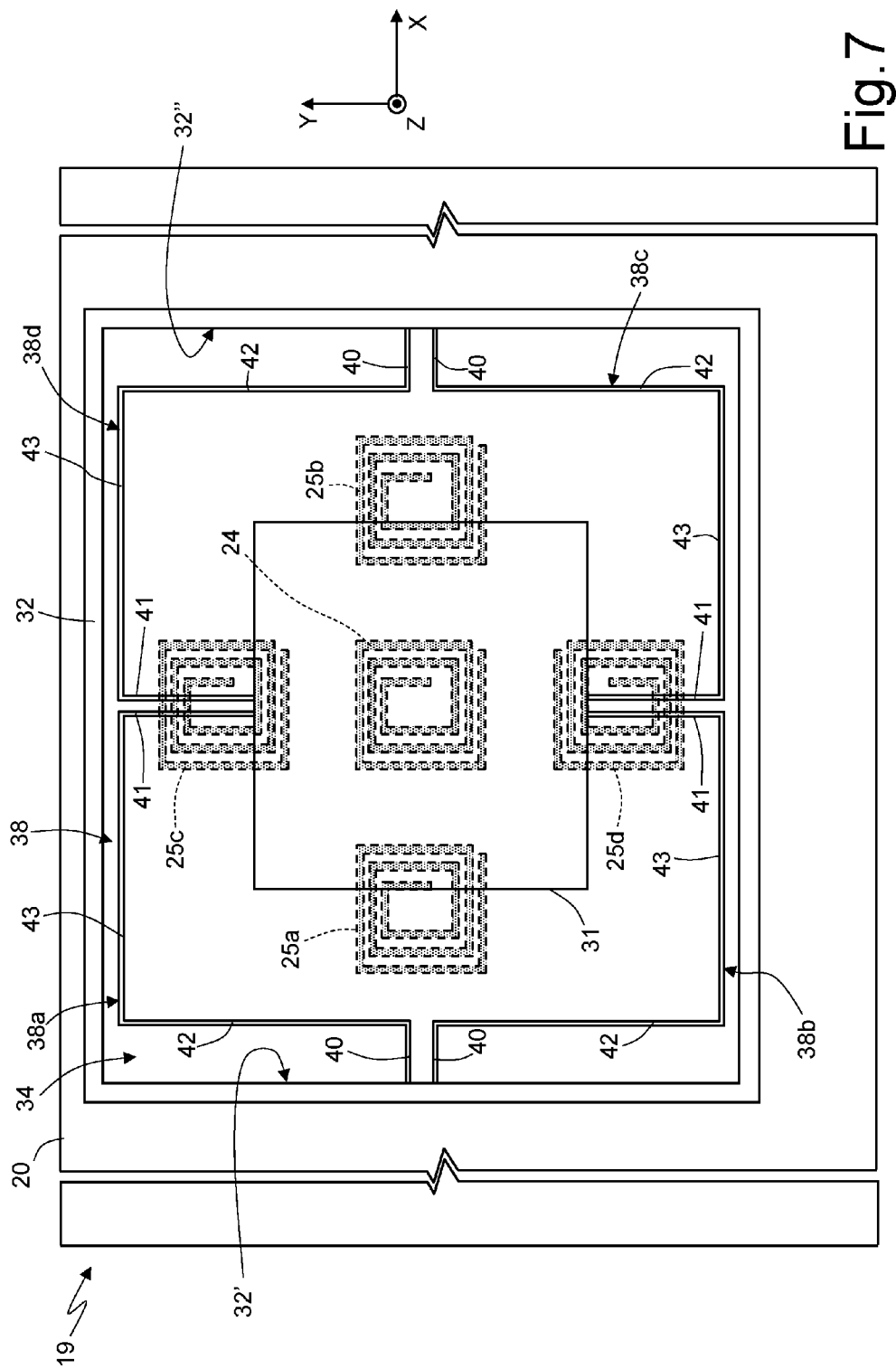

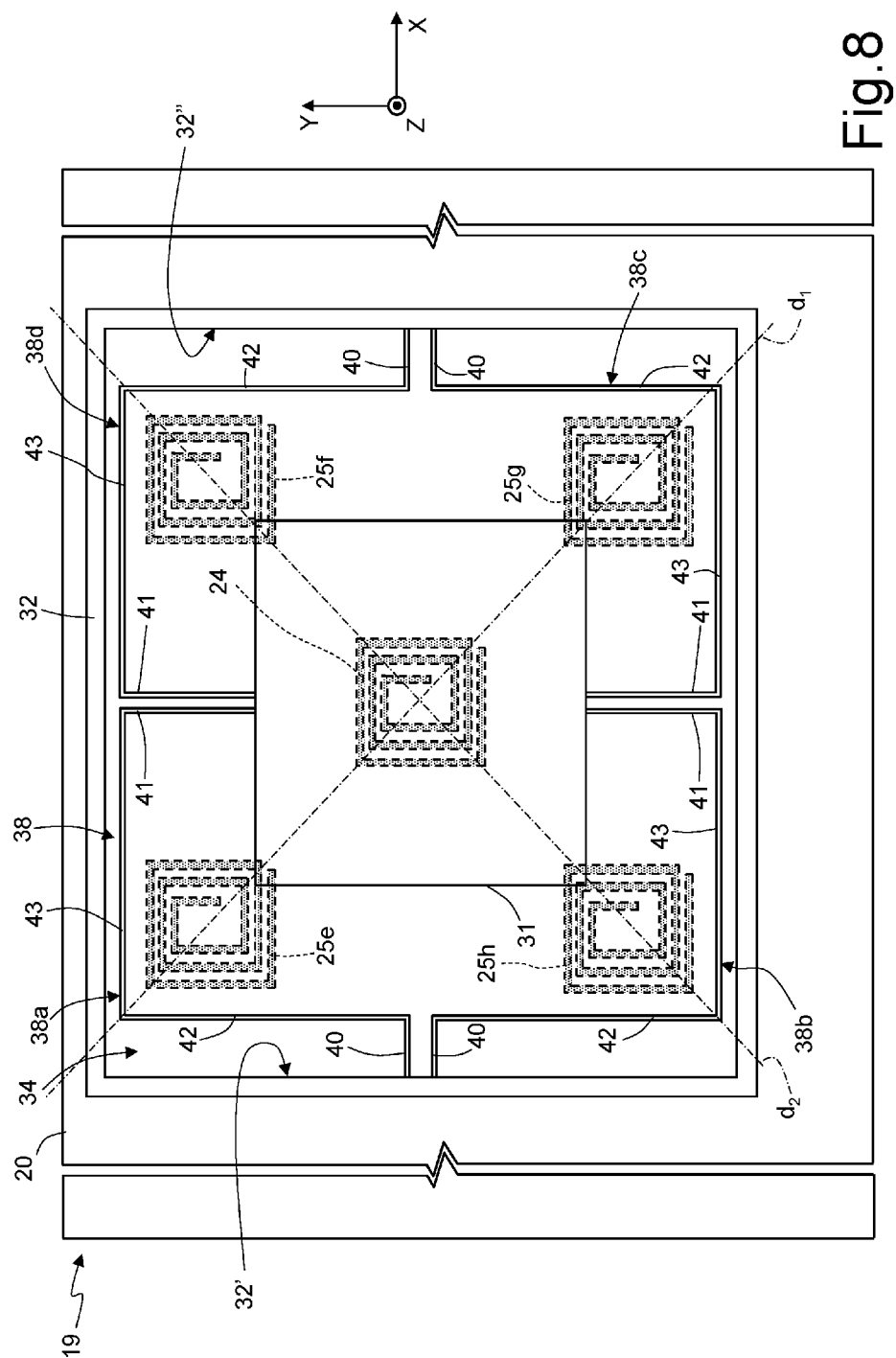

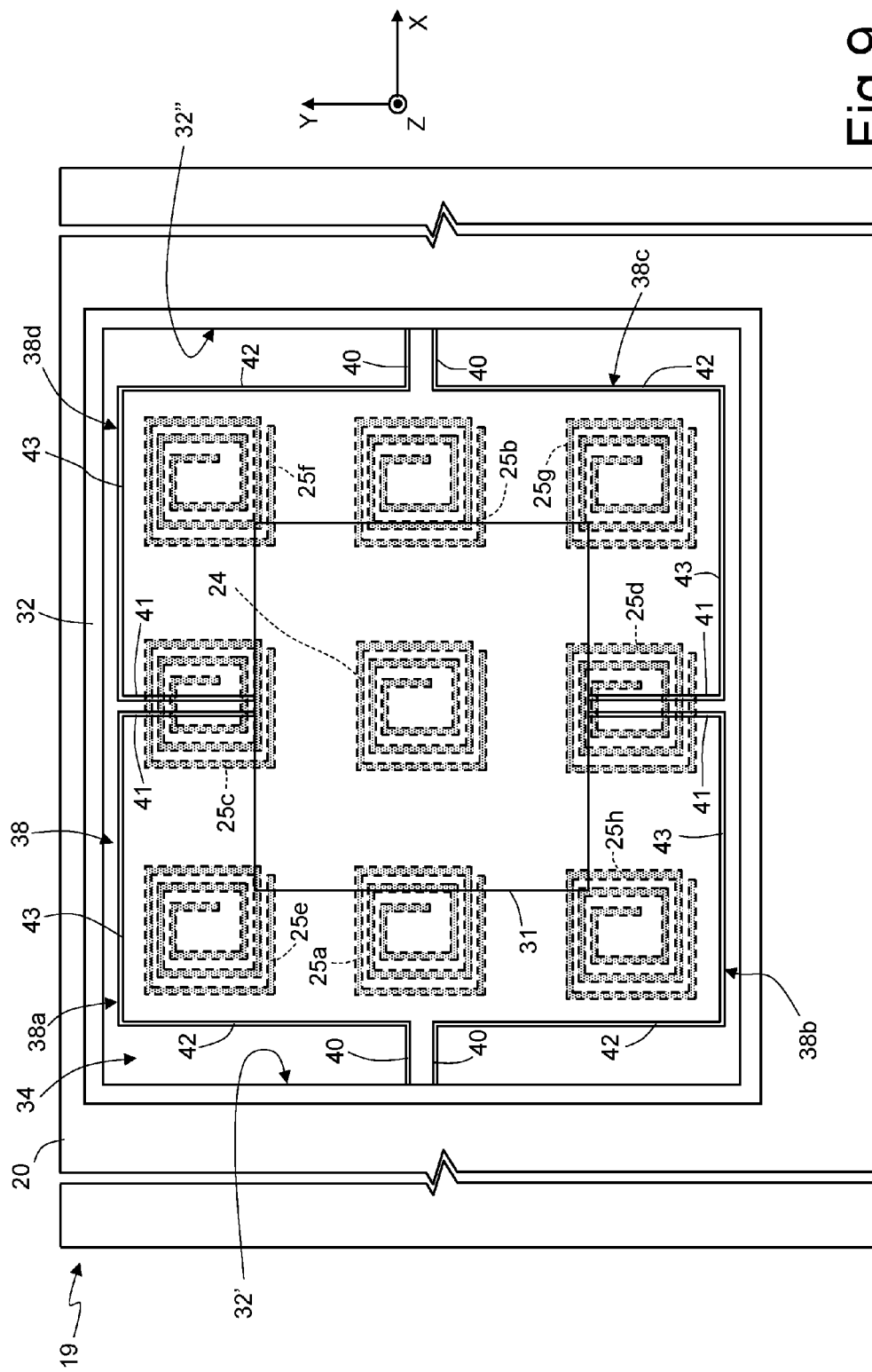

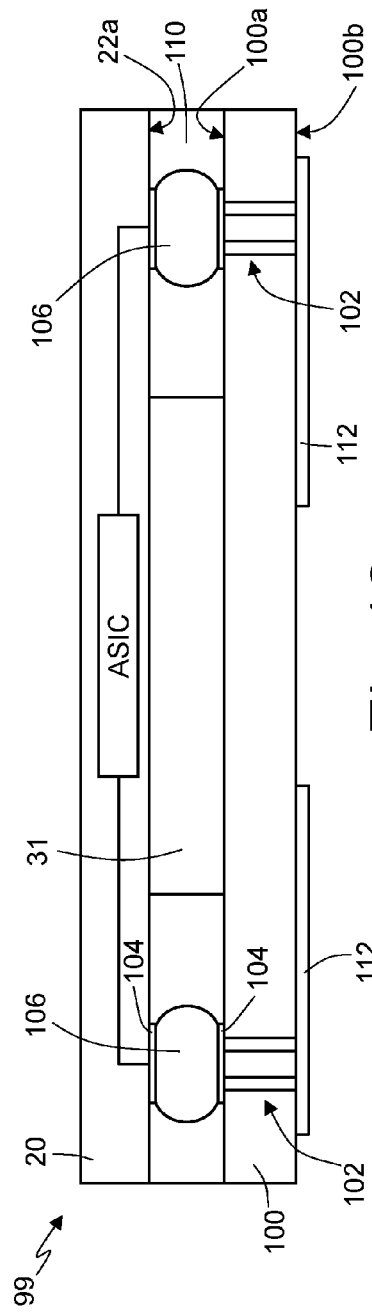
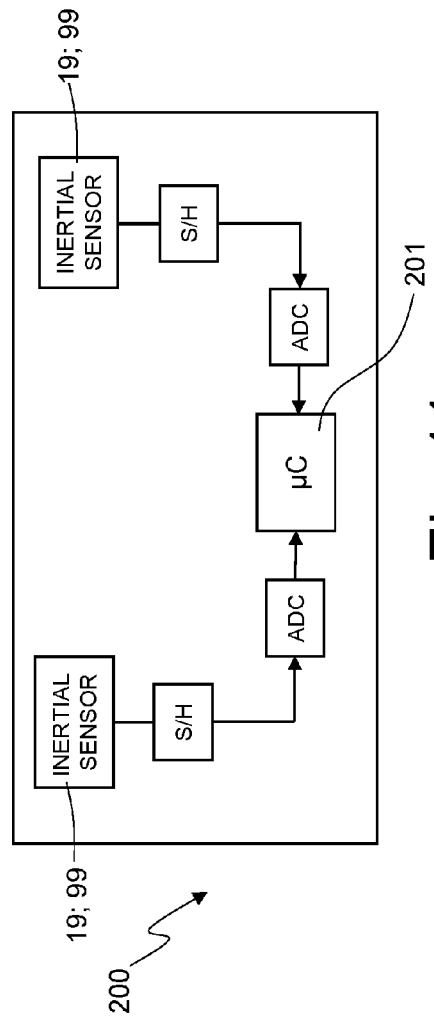

MAGNETIC INERTIAL SENSOR AND METHOD FOR OPERATING THE SAME

BACKGROUND

Technical Field

The present disclosure relates to an inertial sensor, for example, an accelerometer or a gyroscope, of a magnetic type. The present disclosure moreover relates to a method for operating the inertial sensor.

Description of the Related Art

Known to the art are inertial sensors such as accelerometers and gyroscopes for detecting linear or rotational movements, or accelerations, to which the systems that use them are subjected.

Inertial sensors 1 of a known type (see, for example, FIG. 1) are typically manufactured using MEMS technology and comprise a package 2 that encloses the active part of the inertial sensor 1, including a suspended mass 3a subject to stresses. A fixed mass 3b, not subject to said stresses, is set in a predefined position with respect to the suspended mass 3a. According to embodiments of a known type, portions of the suspended mass 3a form respective capacitors C with respective portions of the fixed mass 3b. The relative displacement of the suspended mass 3a from the fixed mass 3b causes a corresponding variation in the capacitance of the aforementioned capacitors C. Said variation of capacitance is correlated to the amount of the relative displacement between the suspended mass 3a and the fixed mass 3b and is used for detecting parameters corresponding to the movement to which the system that encloses the inertial sensor 1 is subjected (for example, in the case of an accelerometer, acceleration).

It is evident that other inertial sensors (e.g., gyroscopes) can operate according to principles different from the one described above.

In any case, irrespective of the particular embodiment of the sensor, the electrical signals generated as a result of the relative movement of the suspended mass 3a with respect to the fixed mass 3b, are supplied to an ASIC 6, or to a generic microcontroller, so as to be processed. For this purpose, electrical connections 7 are provided, generally formed, for example, by means of wires (wire-bonding technique), which connect pads 8a of the inertial sensor 1 with respective pads 8b of the ASIC 6. Said electrical connections 7 are the cause of excessive occupation of space, in addition to being subject to possible failure. Moreover, the electrical connections 7 typically comprise gold or copper, and are hence costly.

BRIEF SUMMARY

One embodiment of the present disclosure is an inertial sensor without electrical connections between the inertial sensor itself (or the package that houses it) and an ASIC (or a generic integrated circuit) that receives and processes data supplied by the inertial sensor.

One embodiment of the present disclosure is directed to an inertial sensor that includes a body made of semiconductor material, having a first surface and a second surface. The body includes an excitation coil and a first sensing coil extending at a first distance from the excitation coil along a first axis. The sensor includes a suspended mass including a magnetic-field concentrator, the suspended mass extending above the first surface and being magnetically coupled to the excitation coil and to the first sensing coil, and configured to be displaced by way of inertia. The sensor also includes a supply and sensing circuit, electrically coupled to the excitation coil and to the first sensing coil, and configured to generate a time-variable flow of electric current through the excitation coil to generate a magnetic field that, in use, interacts with said magnetic-field concentrator to induce an electrical quantity in the first sensing coil, the supply and sensing circuit being configured to measure a value of said electrical quantity induced in the first sensing coil to detect a quantity associated to the displacement of the suspended mass.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein:

FIG. 4 shows a detailed portion of the inertial sensor of FIG. 2 when immersed, in use, in a magnetic field;

FIG. 5 shows the inertial sensor of FIG. 2 during an operating step;

FIGS. 7-9 show, in top plan view, respective embodiments of the inertial sensor according to the present disclosure;

FIG. 10 shows a cross section of an inertial sensor according to a further embodiment of the present disclosure;

FIG. 11 shows a portable system that comprises an inertial sensor according to any embodiment of the present disclosure.

DETAILED DESCRIPTION

Figure 1:
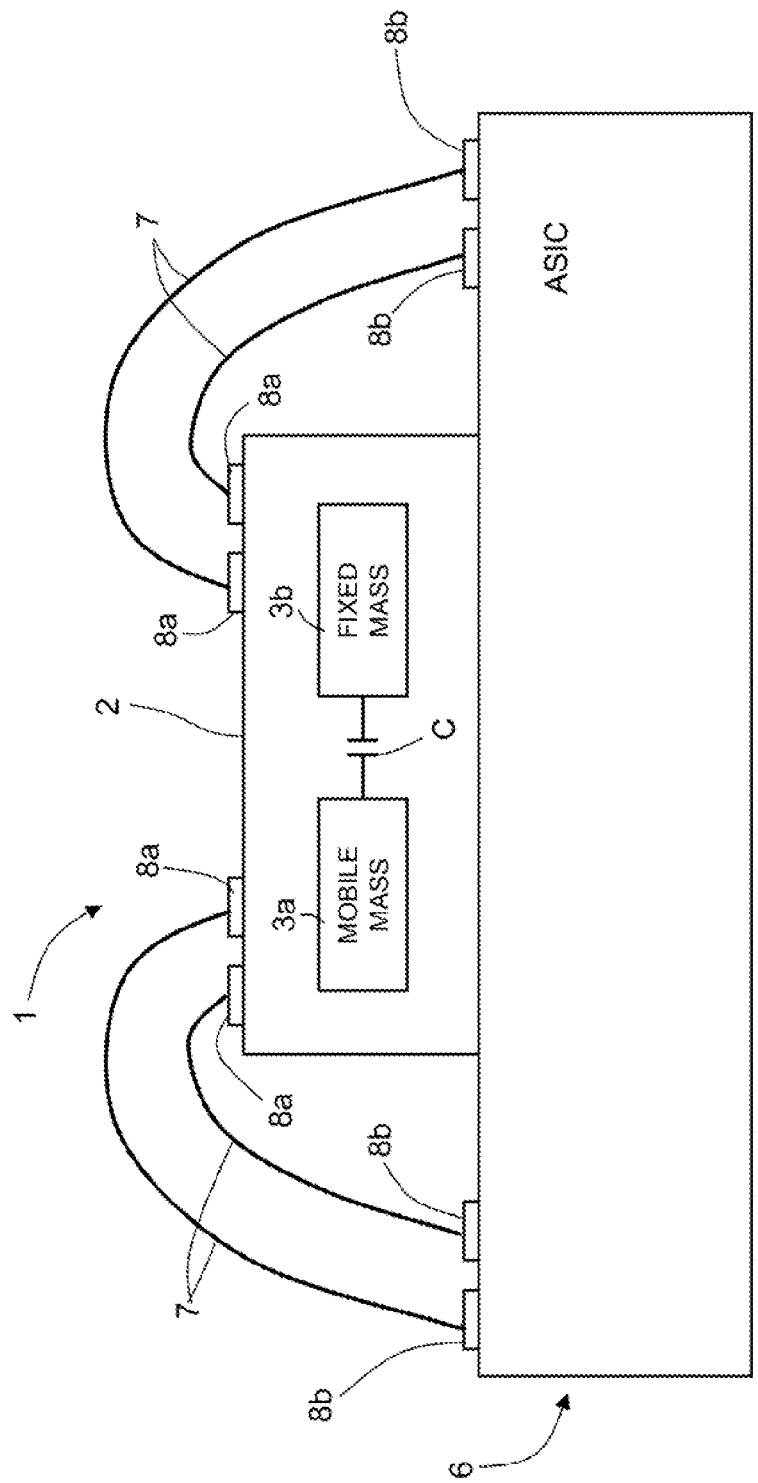
FIG. 1 is a schematic view of an inertial sensor of a known type.
Figure 2:
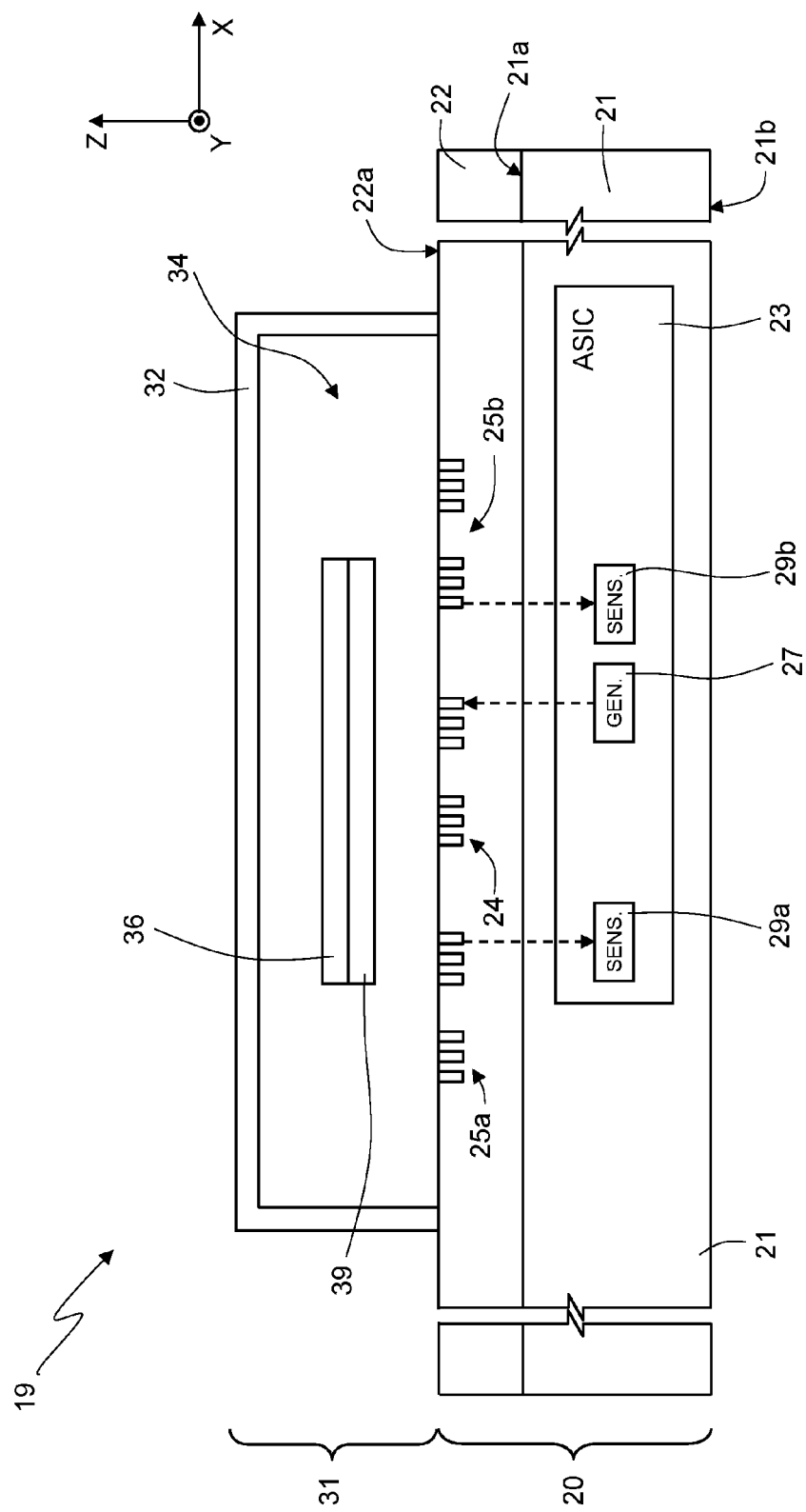
FIG. 2 shows a cross section of an inertial sensor according to one embodiment of the present disclosure.

FIG. 2 shows an inertial sensor 19 of an integrated type, according to one embodiment of the present disclosure.

In detail, a first chip 20 houses an integrated circuit 23, or ASIC, and comprises a substrate 21 made of semiconductor material, for example silicon. The substrate 21 has a first face 21a and a second face 21b, opposite to one another. Formed on the first face 21a of the substrate 21 is (for example, by epitaxial growth) a structural layer 22, which is also, for example, made of semiconductor material such as silicon. Present above the structural layer 22 are, according to one embodiment, one or more levels of conductive paths connected to one another by conductive vias and sealed at the top with a passivation layer (not shown in the figure). The integrated circuit 23 is formed integrated in the substrate 21 or, alternatively, in the structural layer 22, or in both. The structural layer 22 houses an excitation coil 24 and a plurality of sensing coils 25a, 25b. In the embodiment of FIG. 2, the excitation coil 24 and the sensing coils 25a, 25b are planar windings (for example, of a circular or quadrangular shape) of conductive material, in particular metal. In the top plan view of FIG. 3, the excitation coil 24 and the sensing coils 25a, 25b are shown as comprising a plurality of turns of a quadrangular shape. The excitation coil 24 and the sensing coils 25a, 25b are set facing a top surface 22a of the structural layer 22. Alternatively, they can extend, in a way not shown in the figure, within the structural layer 22 at a distance from the top surface 22a, or alternatively, on the top surface 22a of the structural layer 22.

The excitation coil 24 and the sensing coils 25a, 25b comprise a number N of turns, with N chosen according to the design, for example on the basis of the operating frequencies. In particular, at low frequencies we have coils of large dimensions (with a large number of turns and, for example, a diameter of the coils of the order of one millimeter, or some millimeters). At high frequencies the dimensions of the coils are smaller (also the space occupied by the coils within the inertial sensor 19 is accordingly smaller, with coils having, for example, a diameter in the region of one hundred, or some hundreds, of micrometers).

Each of the excitation and sensing coils 24, 25a, 25b further comprises respective conduction terminals (each coil comprises two conduction terminals: terminals 25a', 25a" for the sensing coil 25a; terminals 25b', 25b" for the sensing coil 25b; terminals 24', 24" for the excitation coil 24).

Connected between the conduction terminals of the excitation coil 24 is a signal generator 27, designed to cause flow, in use, of a current I through the excitation coil 24, generating a voltage across the conduction terminals 24', 24" of the latter. In particular, the signal generator 27 is configured for generating a signal, for example, in alternating current (AC), such as a sinusoid or alternatively a square wave, having a given frequency. The frequency can range from one hertz or some hertz up to several gigahertz; for example, it can be comprised between 1 Hz and 300 GHz (extremes included), preferably from 1 kHz to 10 GHz.

Connected between the conduction terminals of the sensing coils 25a, 25b are respective electrical-signal sensors 29a, 29b, configured for detecting a respective current that flows, in use, between the respective conduction terminals of the sensing coils 25a, 25b (or, likewise, configured for detecting the voltage that is set up across the respective conduction terminals of the sensing coils 25a, 25b). Said sensors are, for example, ammeters or voltmeters, or other sensors or meters designed for this purpose.

In FIG. 2 the connection between the sensing coils 25a, 25b and the respective electrical-signal sensors 29a, 29b is schematically indicated by a dashed arrow. Likewise, also the connection between the excitation coil 24 and the signal generator 27 is schematically indicated by a dashed arrow.

The signal generator 27 and the electrical-signal sensors 29a, 29b form, according to one embodiment, part of the integrated circuit 23 (guaranteeing a high level of integration). Alternatively, they can be formed outside the integrated circuit 23 and connected thereto by means of appropriate electrical connections.

With reference to FIG. 2, a MEMS device 31, provided with a packaging structure 32, is set on the top surface 22a of the structural layer 22, and in direct contact with the structural layer 22. Alternatively, the MEMS device 31 can be set facing the top surface 22a of the structural layer 22 but separated from the latter by means of one or more coupling layers, for example a layer of adhesive material. In this way, the packaging structure 32 of the MEMS device 31 is kept fixed with respect to the first chip 20.

The packaging structure 32 defines an internal cavity 34, designed to house the MEMS device 31. In particular, the MEMS device 31 comprises a suspended mass 36, made, for example, of semiconductor material, such as silicon, which is suspended within the cavity 34 by means of a supporting structure 38 (not visible in FIG. 2, and shown in top plan view in FIG. 3). According to respective embodiments, the suspended mass 36 is mobile in one, and/or two, and/or three directions (according to the axes X, Y, Z).

The supporting structure 38 is made, for example, of semiconductor material, for instance silicon. In general, the supporting structure 38 (and possibly also the suspended mass 36) may be made of a material different from a semiconductor material, chosen on the basis of the desired characteristics of flexibility and strength.

Figure 3:
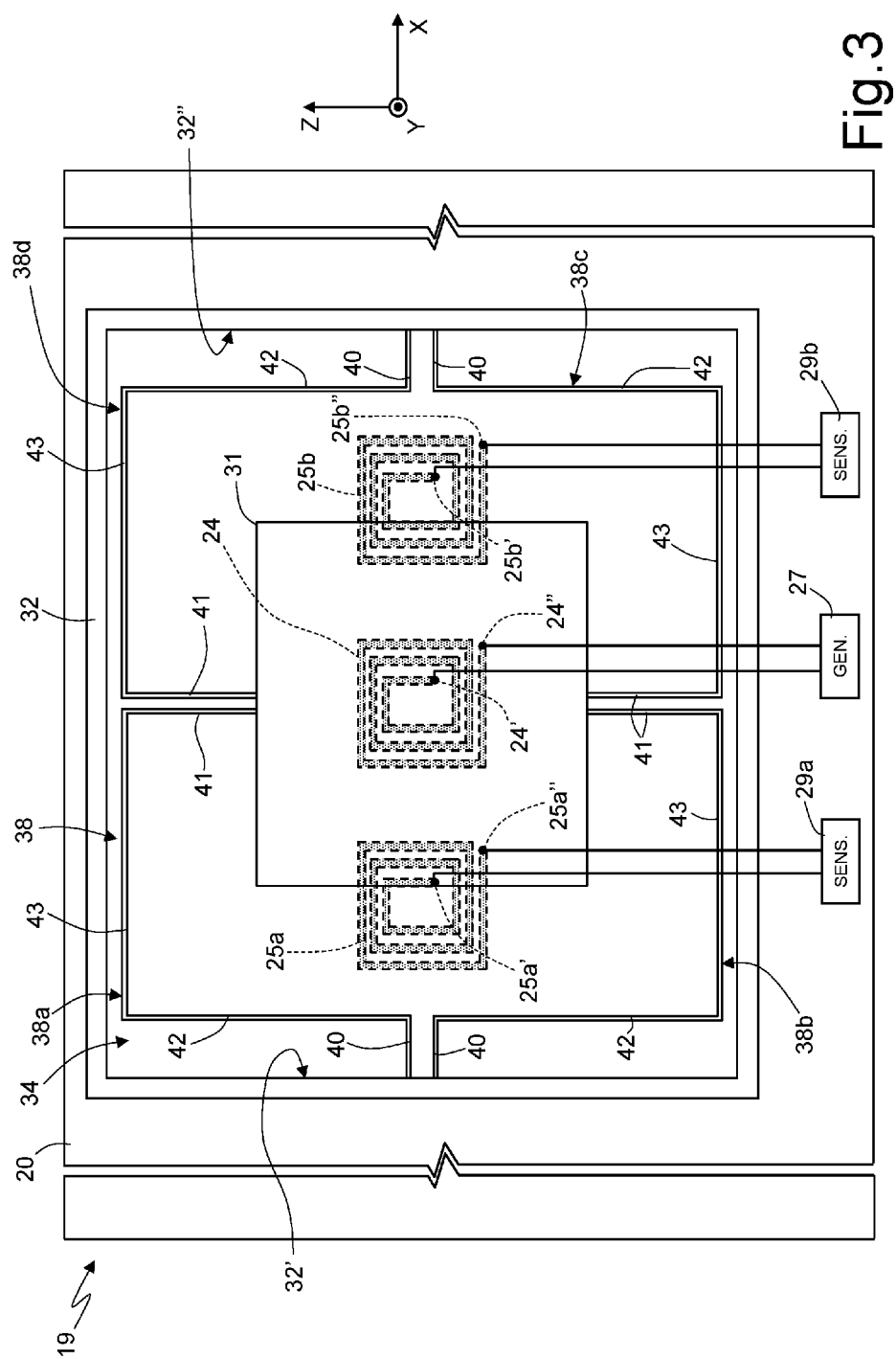
FIG. 3 is a top plan view of the inertial sensor of FIG. 2.

The supporting structure 38 is more clearly visible in FIG. 3, which shows in top plan view the inertial sensor 19 of FIG. 2 (for greater clarity, the packaging structure 32 is shown without the top wall). With reference to FIG. 3, the supporting structure 38 has four arms 38a-38d. Each arm 38a-38d has a first end 40 coupled to a respective wall 32', 32", said walls being internal to the cavity 34, of the packaging structure 32, and a second end 41 coupled to a region of the suspended mass 36. In this embodiment, the suspended mass 36 has a shape, in top plan view, of a quadrilateral, in particular a square (however, any other shape is possible). The respective first ends 40 of the arm 38a and of the arm 38b are coupled to one and the same wall 32' of the packaging structure 32. Likewise, the respective first ends 40 of the arm 38c and of the arm 38d are coupled to one and the same wall 32" of the packaging structure 32 diametrically opposite to the wall 32' to which the first ends of the arms 38a and 38b are coupled. The respective second ends 41 of the arm 38a and of the arm 38d are coupled to one and the same side of the suspended mass 36, whereas the respective second ends 41 of the arm 38b and of the arm 38c are coupled to another one and the same side of the suspended mass 36, diametrically opposite to the side to which the second ends of the arms 38a and 38d are coupled.

Each arm 38a-38d develops, between the respective first and second ends 40, 41, along a path that has respective arm portions 42 and 43 having preferred directions of extension orthogonal to one another. With reference to the axes represented in FIG. 3, the arm portion 42 has a preferred direction of extension along the axis Y, whereas the arm portion 43 has a preferred direction of extension along the axis X.

When subjected to external forces or stresses acting along the axis X (for example, the force of gravity), the suspended mass 36 is set in motion along the axis X by the supporting structure 38. In particular, the arm portions 42 of the respective arms 38a-38d undergo deformation (in particular, they bend) in such a way as to enable a displacement of the suspended mass 36 along the axis X. Likewise, when the suspended mass 36 is subjected to external forces or stresses acting along the axis Y, the arm portions 43 of the respective arms 38a-38d undergo deformation (in particular, they bend) in such a way as to enable a displacement of the suspended mass 36 along the axis Y. It is evident that, for stresses having force components both along the axis X and along the axis Y, both of the arm portions 42, 43 are deformed accordingly to set the suspended mass 36 in motion under the action of the force applied.

The arms 38a-38d moreover enable a movement of the suspended mass 36 in the direction of the axis Z. In this case, both of the arm portions 42, 43 undergo deformation (they bend) in the direction of the axis Z so as to move the suspended mass 36 along Z.

The arms 38a-38d and the suspended mass 36 can be produced in one and the same etching step. In this case, the suspended mass 36 and the arms 38a-38d are made of the same material, and no discontinuities are present between the suspended mass and the arms 38a-38d.

The suspended mass 36 carries or houses a concentrator layer 39, designed to operate as magnetic-field concentrator. The concentrator layer 39 is made of magnetic material, such as, for example, soft magnetic materials, like CoZrTa (amorphous), CoZrO, FeHfN(O), NiFe (permalloy), which can be deposited using known techniques, such as sputtering. In the case where the concentrator layer 39 is made of a soft magnetic material, it may be convenient to improve its characteristics via appropriate processes, for example via thermal magnetization processes (magnetic annealing) or via processes of deposition with external magnetic field. The concentrator layer 39 has a thickness that depends upon the type of material used and upon its characteristics, and said thickness may be comprised, for example, between 0.01 µm and 100 µm, for example, 1 µm.

The concentrator layer 39 extends, according to the embodiment of FIG. 2, on one side of the suspended mass 36, in particular between the suspended mass 36 and the top surface 22a of the structural layer 22, in direct contact with the suspended mass 36 and at a distance from the structural layer 22. In this way, the concentrator layer 39 follows the suspended mass 36 in the movement of the latter. According to one embodiment, the concentrator layer 39 extends on the surface of the suspended mass 36 throughout the extension of the latter. The concentrator layer 39 can extend on just one side of the suspended mass 36 or on both sides, opposite to one another, of the suspended mass 36. The concentrator layer 39 can, alternatively, extend inside the suspended mass 36. If the concentrator layer 39 has also conductive characteristics in addition to magnetic characteristics, as in the case of soft magnetic materials, it can have an appropriate pattern such as to minimize onset of eddy current in order to increase energy transfer from the excitation coil 24 to the sensing coils 25a, 25b. In addition, according to further embodiments, it is also possible to create various layers of magnetic materials possibly alternating with layers of insulating materials, such as, for example, an oxide (e.g., silicon oxide).

The embodiment of the suspended mass 36 is a non-limiting embodiment of the present disclosure. Other embodiments of the suspended mass 36 and of the arms 38a-38d can be provided. In addition, the suspended mass 36 can have any shape.

For an understanding of operation of the inertial sensor 19 initial reference may be made to FIG. 4, regarding a portion of the suspended mass 36 provided with concentrator layer 39.

In the example shown, an external magnetic field $B_{ext}$, having components parallel to the plane XY, interacts with the concentrator layer 39. The concentrator layer 39 produces a concentrated field $B_c$, thanks to the focusing of the lines of flux. At the end of the concentrator layer 39, the lines of magnetic field are partially bent so that there is a component of field along the axis Z. In actual fact, when the magnetic flux exits from one end (here the right-hand end) of the concentrator layer 39, it distributes on a greater surface with respect to the inside of the concentrator layer 39.

FIG. 5 shows the inertial sensor of FIG. 2, where moreover shown are lines of flux of a magnetic field generated by the excitation coil 24. In particular, FIG. 5 shows the plot of the field induced by an excitation current flowing in the excitation coil 24 and able to interact with the concentrator layer 39 at an appropriate frequency.

As is known, in fact, a winding (e.g., the excitation coil 24) carrying a current produces a magnetic field B(r), where r is the distance between the center of the winding and the point of the field considered.

The intensity of the magnetic field B is proportional to the current I that flows in the excitation coil 24.

The intensity and direction of the field depends upon r. In the case considered, the magnetic field B of interest is close to the excitation coil 24, and hence we are substantially in a near-field condition.

If we assume, for simplicity, that, in a resting condition, the concentrator layer 39 has a centroid O vertically aligned (along the axis Z) with the center of the excitation coil 24, in the absence of an external magnetic field the concentrator layer 39 is magnetized in two opposite directions with respect to a plane P parallel to YZ that passes through the centroid O. This fact is shown in the figure by means of arrows 49 having a direction that is opposite (in cross-sectional view) in the left-hand half and in the right-hand half with respect to the plane P. As may be noted, the lines of flux are concentrated within the concentrator layer 39, but are dispersed over a wide area when they leave the lateral ends of the latter. In the absence of an external magnetic field, and assuming a perfect symmetry of the sensing coils 25a and 25b with respect to the excitation coil 24, the two sensing coils 25a and 25b are subjected to magnetic fields $B_a$ and $B_b$ that are substantially symmetrical and have the same intensity. If the current I that supplies the excitation coil 24 is an alternating current, for example a sinusoidal current (in general, a time-variable current), then also the magnetic field ($B_a$, $B_b$) generated by the excitation coil 24 is a sinusoidal field (or, in more general terms, a time-variable field). Said magnetic field follows, that is, the evolution of the current I. The magnetic fields $B_a$ and $B_b$ induce a respective time-variable voltage (current) in the sensing coils 25a and 25b. According to what has been said, in the resting condition of FIG. 5, the sensing coils 25a and 25b perceive respective induced voltages having the same value. A corresponding current flows in the sensing coils 25a and 25b and can be detected by means of sensing instruments or circuits of a known type (and that do not form the subject of the present disclosure).

Along the axis parallel to Z and passing through the center (or centroid) of the excitation coil 24, the intensity of the magnetic field generated by the excitation coil 24 can be expressed by Eq. (1), where for simplicity there has been considered the center of the excitation coil 24 as the origin of the axes X, Y, Z, and a circular shape of the excitation coil 24 (however, what has been said applies by analogy to coils of a different shape, in particular square coils)

$$B = \frac{\mu_0 N a^2 I}{2(a^2 + z^3)^{3/2}} \tag{1}$$

where B is a value of magnetic field measured in Tesla, and $\mu_0 = 4\pi \cdot 10^{-7}$ is the magnetic permeability of vacuum, N is the number of turns of the excitation coil 24, I is the peak value (in amps) of the current that flows in the excitation coil 24, a is the radius (in meters) of the excitation coil 24, and z is the axial distance (in meters) from the center of the excitation coil 24 (corresponding, as has been said, for simplicity, to the origin of the axes).

Hence, a current variable in a sinusoidal way in time in the excitation coil 24 produces a magnetic field that varies in a sinusoidal way in time. The concentrator layer 39 interacts with said magnetic field and supplies a corresponding magnetic field $B_a$, $B_b$ to the sensing coils 25a and 25b (see the path of the lines of field of FIG. 5). The portion of magnetic field $B_a$, $B_b$ that passes through the sensing coils 25a and 25b produces, across conduction terminals of the sensing coil 25a and of the sensing coil 25b, a respective voltage that varies in a sinusoidal way in time. For example, a voltage $V_a$ is generated between conduction terminals of the sensing coil 25a, and a voltage $V_b$ is generated between conduction terminals of the sensing coil 25b.

In the case where the suspended mass 36 (and hence the concentrator layer 39) is in a resting position, i.e., set at the same distance, along the axes X, Y, Z, from the sensing coils 25a and 25b, then $V_a=V_b$. Instead, if the suspended mass 36 (and hence the concentrator layer 39) is set in a position not at the same distance, in particular along the axis X in the example shown, from the sensing coils 25a and 25b, then $V_a \neq V_b$. For movements of the suspended mass 36 along the axis X considered, there is hence a differential-mode variation of the magnetic field perceived by the sensing coils 25a and 25b.

The voltages $V_a$, $V_b$ generated between the terminals of the sensing coils 25a, 25b are due, as is known, to the phenomenon of electromagnetic induction. Assume that the magnetic field supplied by the concentrator layer 39 to the sensing coils 25a, 25b is such that the latter are completely immersed, at a certain instant in time, in a uniform field (the sensing coils 25a, 25b have a small size with respect to the field considered). In this situation, the flux $\phi_a$, $\phi_b$ of the magnetic-field vector $B_a$, $B_b$ (corresponding to the magnetic fields $B_a$ and $B_b$, respectively) through the respective sensing coil 25a, 25b is defined as the product of the area $A_a$, $A_b$ of the respective sensing coil 25a, 25b multiplied by the component of $B_a$, $B_b$ normal to the plane of lie (here XY) of the respective sensing coil 25a, 25b. The flux through the sensing coil 25a is hence $\phi_a = A_a \cdot B_a \cdot \cos \alpha_a$; the flux through the sensing coil 25b is $\phi_b = A_b \cdot B_b \cdot \cos \alpha_b$.

The angle $\alpha_a$ ($\alpha_b$) is the angle between the vector $B_a$ ($B_b$) and the normal to the plane of lie of the respective sensing coil 25a (25b). In the case considered, we can assume, approximately, $\alpha_a = \alpha_b \approx 0$ or $\pi$, and hence $\cos \alpha_{a,b} \approx 1$.

From Faraday's law of induction we have that the voltage induced in a turn of the sensing coil 25a is the time derivative of the flux $\phi_a$ (with change of sign), and the voltage induced in a turn of the sensing coil 25b is the time derivative of the flux $\phi_b$ (with change of sign). If the sensing coils 25a, 25b have the same number N of turns, we have that the voltage induced in the sensing coils 25a is $$V_a = -N\frac{d\Phi_a}{dt} = -NA_a \cos \alpha_a \frac{dB_a}{dt} \qquad (2)$$

and the voltage induced in the sensing coils 25b is $$V_b = -N\frac{d\Phi_b}{dt} = -NA_b \cos \alpha_b \frac{dB_b}{dt} \qquad (3)$$

Equations (2) and (3) use units of the International System. The voltage is expressed in volts, the flux in weber, the magnetic field in tesla, the area in square meters, time in seconds.

According to one embodiment, the current I through the excitation coil 24 varies in a sinusoidal way in time at a certain frequency; consequently, also the magnetic field B generated thereby varies in a sinusoidal way in time at the same frequency. The magnitude B of the magnetic-field vector B generated by the excitation coil 24 can be written as $$B = 1/2 \cdot B_{pp} \cdot \cos(\omega t) \qquad (4)$$

where $B_{pp}$ is the peak-to-peak value of the magnetic field, and $\omega$ is the angular frequency of the current I that flows in the excitation coil 24. The peak-to-peak value $B_{pp} = B_{pp}(r)$ of the magnetic field varies in space (i.e., depends upon the spatial position r considered), but not in time.

Equation (4) can be applied also to the fields supplied to the sensing coils 25a, 25b by means of the concentrator layer 39, so that we have, for the sensing coil 25a, $$B_a = 1/2 \cdot B_{pp,a} \cdot \cos(\omega t) \qquad (5)$$

and, for the sensing coil 25b, $$B_b = 1/2 \cdot B_{pp,b} \cdot \cos(\omega t) \qquad (6)$$

where $B_{pp,a}$ and $B_{pp,b}$ are the peak-to-peak values of the magnetic field around the sensing coil 25a and the sensing coil 25b. Since, as has been said, the peak-to-peak value of the magnetic field varies with the spatial position r considered, if the suspended mass is not symmetrical with respect to the sensing coils 25a, 25b, the latter are immersed in a respective magnetic field having peak-to-peak values $B_{pp,a}$ and $B_{pp,b}$ different from one another.

If we combine Eqs. (2) and (5) we obtain $$V_a = \frac{1}{2} \omega N A_a B_{pp,a} \cos \alpha_a \sin \omega t \qquad (7)$$

If we combine Eqs. (3) and (6) we obtain $$V_b = \frac{1}{2} \omega N A_b B_{pp,b} \cos \alpha_b \sin \omega t \qquad (8)$$

The peak-to-peak voltage value $V_{pp,a}$ and $V_{pp,b}$ ($\alpha_a = \alpha_b = 0$ or $\alpha_a = \alpha_b = \pi$) in the sensing coils 25a, 25b is given by Eqs. (9) and (10), respectively $$V_{pp,a} = \omega \cdot N \cdot A_a \cdot B_{pp,a} \qquad (9)$$

$$V_{pp,b} = \omega \cdot N \cdot A_b \cdot B_{pp,b} \qquad (10)$$

It is thus possible to identify, on the basis of the value assumed by the voltage (in particular, the peak-to-peak voltage value) present on the conduction terminals of the sensing coils 25a, 25b, the direction and sense of displacement of the suspended mass 36, in particular, according to the example considered, along the axis X. For example, an increase in the value of $V_{pp,a}$ with respect to a threshold value $V_{th,a}$ and, simultaneously, a reduction in the value of $V_{pp,b}$, can be interpreted as a displacement of the suspended mass 36 along the axis X towards the sensing coil 25a. Likewise, an increase in the value of $V_{pp,b}$ with respect to a threshold value $V_{th,b}$ and, simultaneously, a reduction in the value of $V_{pp,a}$, can be interpreted as a displacement of the suspended mass 36 along the axis X towards the sensing coil 25b. The threshold values $V_{th,a}$ and $V_{th,b}$ are, for example, equal to the peak-to-peak value of the voltage that is set up between the terminals of the respective sensing coil 25a, 25b in the resting condition shown in FIG. 5 (suspended mass 36 equidistant from the sensing coils 25a, 25b). If the maximum value and minimum value that $V_{pp,a}$ and $V_{pp,b}$ can assume are known, it is moreover possible to identify precisely in which position the suspended mass 36 is located along the axis X (by means of a simple proportion).

Figure 6:
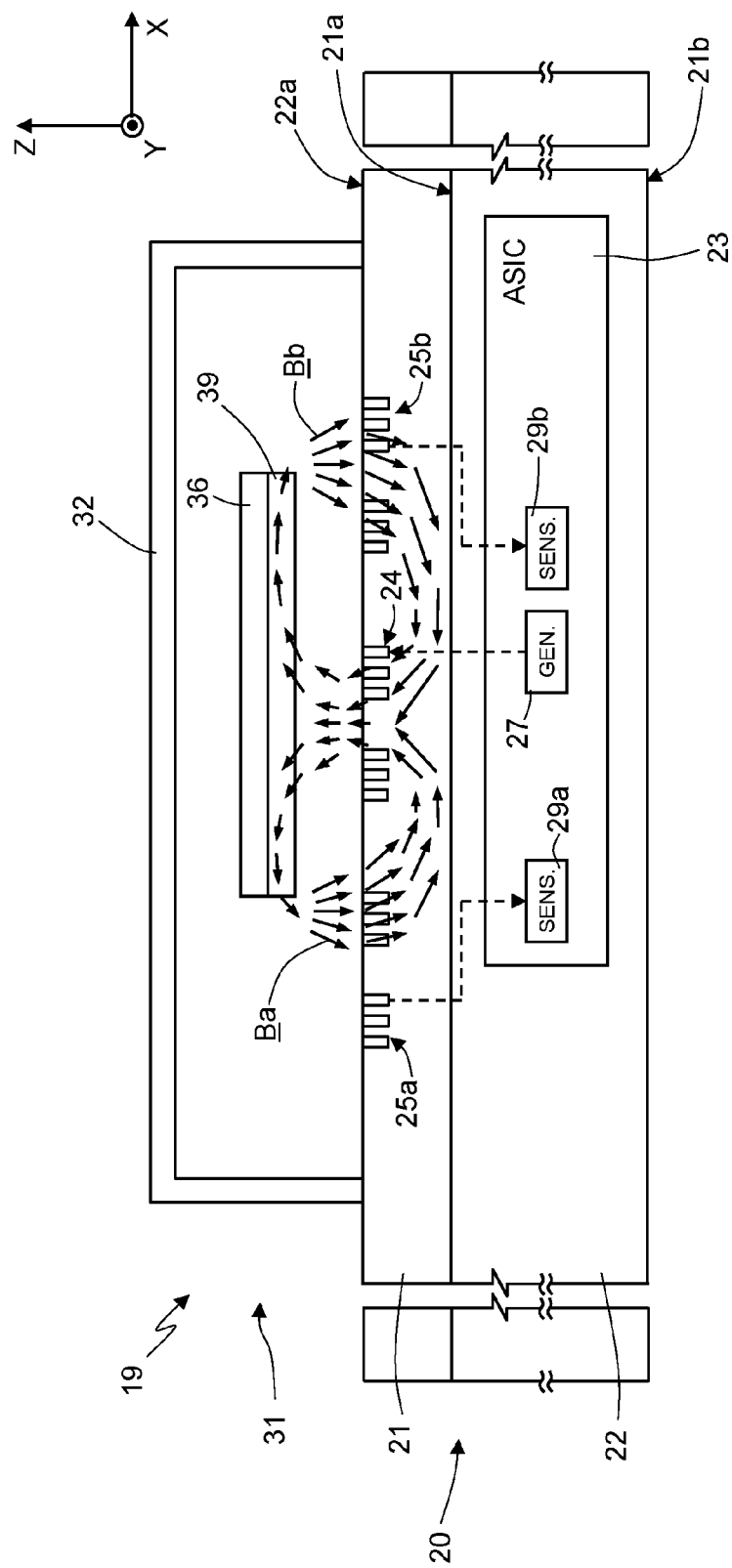
FIG. 6 shows the inertial sensor of FIG. 2 during a further operating step.

Reference may be made, for example, to FIG. 6, which shows a displacement of the suspended mass 36 to the right along the axis X (in the direction of the sensing coil 25b), and where the field vectors show visually that the magnetic field $B_b$ impinges the sensing coil 25b to a greater extent than does the magnetic field $B_a$ on the sensing coil 25a (in this case, $B_{pp,b}$ through the sensing coil 25b is greater than $B_{pp,a}$ through the sensing coil 25a and, consequently, $V_{pp,b} > V_{pp,a}$).

In the case of the example of FIG. 5 and FIG. 6 just two sensing coils 25a, 25b have been considered, set along the axis X diametrally with respect to the center of the excitation coil 24. It is evident that what has been said applies also with reference to the axis Y, provided that a further two sensing coils 25c, 25d are set along the axis Y, symmetrically with respect to the center of the excitation coil 24 (see the embodiment shown in FIG. 7). In this case, further electrical-signal sensors (not shown) can be envisaged, coupled to the conduction terminals of the sensing coils 25c, 25d, to detect the voltage/current induced in the sensing coils 25c, 25d in a way similar to what has been described previously with reference to the sensing coils 25a, 25b.

According to a further embodiment, shown in FIG. 8, sensing coils 25e-25h are arranged along diagonals $d_1$ and $d_2$ extending with an angle respectively of approximately ±45° with respect to the extension of the axis Y. Also in this case, the sensing coils 25e-25h are at the same distance with respect to the excitation coil 24.

FIG. 9 shows a further embodiment in which both the sensing coils 25a-25d of FIG. 7 and the sensing coils 25e-25h of FIG. 8 are present.

Irrespective of the configuration of the sensing coils, according to the variants shown in FIGS. 3 and 7-9, the inertial sensor 19 is configured for operating as acceleration sensor (accelerometer). This is possible by exploiting the Doppler effect, which applies to the magnetic wave emitted by the concentrator layer 39 when the latter is set in motion by the suspended mass 36, towards one sensing coil and away from another sensing coil.

As is known, the Doppler effect regards the apparent frequency of a wave (sound wave, electromagnetic wave, etc.) perceived by an observer in a relative way with respect to the source that emits the wave. The frequency perceived hence depends upon the relative velocity between the observer and the source. When the observer and the source are approaching one another, the frequency of the wave emitted by the source is perceived, by the observer, as higher than the effective frequency; instead, when the observer and the source are moving away from one another, the frequency of the wave emitted by the source is perceived, by the observer, as lower than the effective frequency.

In the case in question, the source of the magnetic wave is the concentrator layer 39 (according to what has been described previously, for example with reference to FIG. 4), and the observers are the sensing coils. For simplicity, just the sensing coils 25a, 25b are considered in what follows (as in FIG. 3), and the suspended mass 36 is assumed as moving along X.

It is moreover considered that the inertial sensor 19, in the resting condition, is configured in such a way that: i) the signal generator 27 supplies to the excitation coil 24a sinusoidal current signal I with frequency f; ii) the magnetic field generated by the excitation coil 24 varies in time at the same frequency f as that of the current signal I; iii) the magnetic fields $B_a$ and $B_b$ supplied by the concentrator layer 39 to the sensing coils 25a, 25b vary in time with the frequency f; and iv) the electrical signals (voltage/current) induced in the sensing coils 25a, 25b by the magnetic fields $B_a$ and $B_b$ are sinusoidal signals with frequency f.

According to one embodiment, the frequency f of the sinusoidal signal supplied by the signal generator 27 has a value comprised between 1 kHz and 10 GHz, for example equal to 1 GHz. The value of frequency used can moreover be chosen also on the basis of the type of magnetic material used for producing the concentrator layer 39.

Now assume that the suspended mass 36 is moving along X, in particular towards the sensing coil 25b and away from the sensing coil 25a. Owing to the Doppler effect, we have that the frequency of oscillation in time of the magnetic field $B_b$ "perceived" by the sensing coil 25b (frequency $f_{R\_b}$) is higher than the frequency of oscillation in time of the magnetic field $B_a$ "perceived" by the sensing coil 25a (frequency $f_{R\_a}$). More in particular, we have that $f_{R\_a} < f < f_{R\_b}$. Consequently, also the frequency of the voltage/current signal induced in the sensing coil 25b oscillates in a sinusoidal way with a frequency equal to $f_{R\_b}$, higher than the frequency of the voltage/current signal induced in the sensing coil 25a (the latter being equal to $f_{R\_a}$).

The main contribution to the Doppler effect, to a first approximation, is due principally to the propagation of the electromagnetic wave in the concentrator layer 39. In particular, the electromagnetic wave slows down according to the characteristics of the magnetic material. In this sense, the electromagnetic wave slows down to a greater extent the greater the relative magnetic permeability at the frequency of interest, and its wavelength decreases accordingly.

For example, to first approximation, at the frequency of 1 GHz with a relative magnetic permeability $\mu_R=1000$, we have a wavelength λ of approximately 1 cm in the magnetic material. In one embodiment, the system operates with distributed parameters only in the magnetic material of the concentrator layer 39, and with concentrated parameters in the portions of magnetic coupling between the excitation coil 24 and the concentrator layer 39, and between the concentrator layer 39 and the sensing coils 25a, 25b. In particular, it is expedient that in a given portion of the concentrator layer 39 there is comprised at least one non-negligible fraction of the wavelength, for example λ/2 (it is thus possible to detect phenomena of variation of the frequency due to the Doppler effect).

To a first approximation, we have $$f_{R\_a} = f(1 - V_{SM}/v_{EW}) \quad (11)$$

and $$f_{R\_b} = f(1 + V_{SM}/v_{EW}) \quad (12)$$

where $V_{SM}$ is the velocity at which the suspended mass 36 moves (component of velocity along X in the example considered) and $v_{EW}$ is the velocity of the electromagnetic wave in the concentrator layer 39, which, at the frequency of interest, is given by $$v_{EW} = \frac{1}{\sqrt{\mu_0 \mu_R \varepsilon_0 \varepsilon_R}} = \frac{c}{\sqrt{\mu_R \varepsilon_R}} \quad (13)$$

The apparent wavelength values, detected by the sensing coils 25a, 25b, are given by Eqs. (14) and (15) below ($\lambda_a$ and $\lambda_b$ are the wavelengths associated to the frequencies $f_{R\_a}$, and $f_{R\_b}$, respectively)

$$f_{R\_a} = V_{EW}/\lambda_a \quad (14)$$

and $$f_{R\_b} = V_{EW}/\lambda_b \quad (15)$$

The approximations of Eqs. (14) and (15) apply for velocities of movement of the suspended mass 36 that are small as compared to the speed of light.

We thus have (λ is the wavelength associated to the frequency f in the magnetic material)

$$v_{EW}/\lambda_a = (v_{EW}/\lambda)\cdot(1-V_{SM}/v_{EW}) \quad (16)$$

and $$v_{EW}/\lambda_b = (v_{EW}/\lambda)\cdot(1+V_{SM}/v_{EW}) \quad (17)$$

whence $$1/\lambda_a = (1/\lambda)(1-V_{SM}/v_{EW}) \quad (18)$$

and $$1/\lambda_b = (1/\lambda)(1+V_{SM}/v_{EW}) \quad (19)$$

Finally, we have $$\lambda_a \approx \lambda(1+V_{SM}/v_{EW}) \quad (20)$$

and $$\lambda_b \approx \lambda(1-V_{SM}/v_{EW}) \quad (21)$$

Since the values of λ, $\lambda_a$, and $\lambda_b$ are known or in any case can be derived easily during use of the inertial sensor 19, it is possible to obtain the value of velocity $V_{SM}$ at which the suspended mass 36 moves, i.e., $V_{SM} \approx v_{EW}(\lambda_a/\lambda - 1)$ or, equivalently, $V_{SM} \approx v_{EW}(\lambda_b/\lambda - 1)$.

If we carry out an operation of time derivative of the value of velocity $V_{SM}$ thus obtained, we obtain the value of acceleration to which the suspended mass 36 is subjected in use.

Together with the Doppler effect, or as an alternative thereto, also for low frequencies, as mentioned previously, we have that the suspended mass 36 by moving carries out an amplitude modulation of the signals of the sensing coils 25a, 25b. According to one embodiment, we can use circuits for numeric processing of the signals such that we can easily obtain the direction of movement of the suspended mass 36, and also its velocity and acceleration, after sampling of the values of amplitude of at least one electrical parameter (for example, a voltage or current) of the sensing coils 25a, 25b. Said processing circuits can be present in the ASIC 23 or may even be external thereto.

Since, according to what has been described, the inertial sensor 19 is designed to detect both the direction of displacement of the suspended mass 36 and the acceleration of the latter, the inertial sensor 19 operates as an accelerometer.

The inertial sensor 19 is moreover designed to detect displacements of the suspended mass 36 in the direction Z. In this case, said sensing is made by detecting a common-mode increase of the magnetic field (and consequently of the induced voltage/current signal) on all the sensing coils present. In fact, in the movement along the axis Z of the suspended mass 36, there is observed an increase/decrease in the amplitude of all the signals detected by the sensing coils 25a, 25b in the case where the suspended mass 36 approaches/moves away from the sensing coils 25a, 25b.

According to all the embodiments shown and described, there is not present a wired electrical connection between the MEMS device and the ASIC. The latter are, in fact, coupled to one another magnetically and/or electromagnetically. The advantages of this configuration are evident, and connections by means of bonding wires that are costly and delicate are avoided. There is moreover a saving in space.

FIG. 10 shows an inertial sensor 99 according to a further embodiment of the present disclosure. According to FIG. 10, the packaging structure 32 that houses the MEMS device 31 is set between the chip 20 that carries the ASIC 23 and an organic substrate 100. The chip 20 has the function of cap for the packaging structure 32. The organic substrate 100 has a plurality of through vias 102, which are designed to form an electrical connection between opposite faces 100a, 100b of the organic substrate 100. Both the chip 20 and the organic substrate 100 have contact pads 104 that extend on respective faces 22a and 100a of the chip 20 and of the organic substrate 100 facing one another.

Contact pads 104 of the chip 20 aligned, along the axis Z, to respective contact pads 104 of the organic substrate 100 are electrically connected together by means of solder bumps 106. Moreover, to guarantee electrical insulation and a greater tightness, said solder bumps 106 are embedded in a non-conductive layer of resin 110.

The packaging structure 32, with the MEMS device 31, and the chip 20 (ASIC) are magnetically coupled to one another and operate as described previously with reference to FIGS. 2-9.

The face 100b of the organic substrate 100 has conductive paths 112, electrically connected to the through vias 102. In this way, the ASIC 23 is electrically connected to the conductive paths 112, and via the latter can receive and send electrical signals from/towards a generic external system.

Coupling between the chip 20 carrying the ASIC 23, the MEMS device 31, and the organic substrate 100 is preferably made using the flip-chip technique.

The advantages of the embodiment of FIG. 10 lie in an inertial sensor 99 having considerably reduced dimensions (in top plan view the area occupied is equivalent to the one that would be occupied by the ASIC alone). Moreover, the inertial sensor 99 does not have a further external package in so far as the active parts of the sensor are protected by the ASIC itself at the top, by the organic substrate at the bottom, and by the resin regions at the sides.

FIG. 11 is a schematic illustration of a portable electronic system 200, for example a laptop, a notebook, a cell phone, a handheld pointing device, or some other device. The portable electronic system 200 comprises one or more inertial sensors 19 and/or 99 according to any of the embodiments of the present disclosure described previously. The inertial sensors 19, 99 are designed to detect one or more directions of movement of the portable electronic system 200 and/or the acceleration to which said portable electronic system 200 is subjected in use, and to communicate the information detected to a microcontroller 201 for the purposes envisaged by the specific application. The connection between each inertial sensor 19, 99 and the microcontroller 201 comprises, according to one embodiment, a signal-processing chain, for example including a sample-and-hold circuit S/H and an analog-to-digital converter ADC.

Other applications of the inertial sensors 19, 99 are possible: for example, they can be set on vehicles, for detecting sharp decelerations, or impact of said motor vehicles, or any other application in which an accelerometer and/or a movement sensor can be utilized.

Finally, it is clear that modifications and variations may be made to the inertial sensor described and illustrated herein, without thereby departing from the sphere of protection of the present disclosure.

For example, it is possible to vary, during use of the inertial sensor 19, the frequency of the signal supplied to the excitation coil 24, thus varying accordingly, as illustrated previously, the frequency of oscillation of the magnetic field generated by the excitation coil 24 and detected by the sensing coils.

If the frequency is increased with respect to a base value (for example, if the base frequency is 1 GHz and is brought to some gigahertz), we have a consequent increase in the sensitivity and resolution of the inertial sensor 19, given the same boundary conditions (in particular, given the same mutual distances between the excitation/sensing coils and the suspended mass).

According to a further embodiment, and as mentioned previously, it is possible to use a frequency of oscillation of the magnetic field generated by the excitation coil 24 that is low (for example, between 10 MHz and 100 MHz, extremes included) and detect variations of values of amplitude of at least one electrical parameter (for example, voltage or current) of the sensing coils, thanks to the variation of the reluctance of the magnetic circuits (which increases as the length of the gap between the concentrator layer 39 and the surface 22a increases).

The reluctance increases as the length of the magnetic path of the flux outside the concentrator layer 39 increases, whereas it is inversely proportional to the permeability of the material in which the magnetic field considered flows (ease of the material to let the magnetic field through). It is thus possible, in a way similar to what has been described previously, to detect movements of the mobile mass by detecting variations of the reluctance via variations of amplitude of at least one electrical parameter (voltage or current). For instance, considering a case of example in which just two sensing coils 25a, 25b are present, when the mobile mass, displacing, approaches one sensing coil 25a, the reluctance of the path that comprises the excitation coil 24, the concentrator layer 39, the sensing coil 25a, and the gap between the concentrator layer 39 and the surface 22a decreases, and thus the amplitude of a corresponding electrical parameter (voltage or current) increases. Instead, the reluctance of the path that comprises the excitation coil 24, the concentrator layer 39, the sensing coil 25b, and the gap between the concentrator layer 39 and the surface 22a increases, and thus the amplitude of a corresponding electrical parameter (voltage or current) decreases. The motion of the mobile mass towards the sensing coil 25a and away from the sensing coil 25b is thus obtained.

Figure 12:
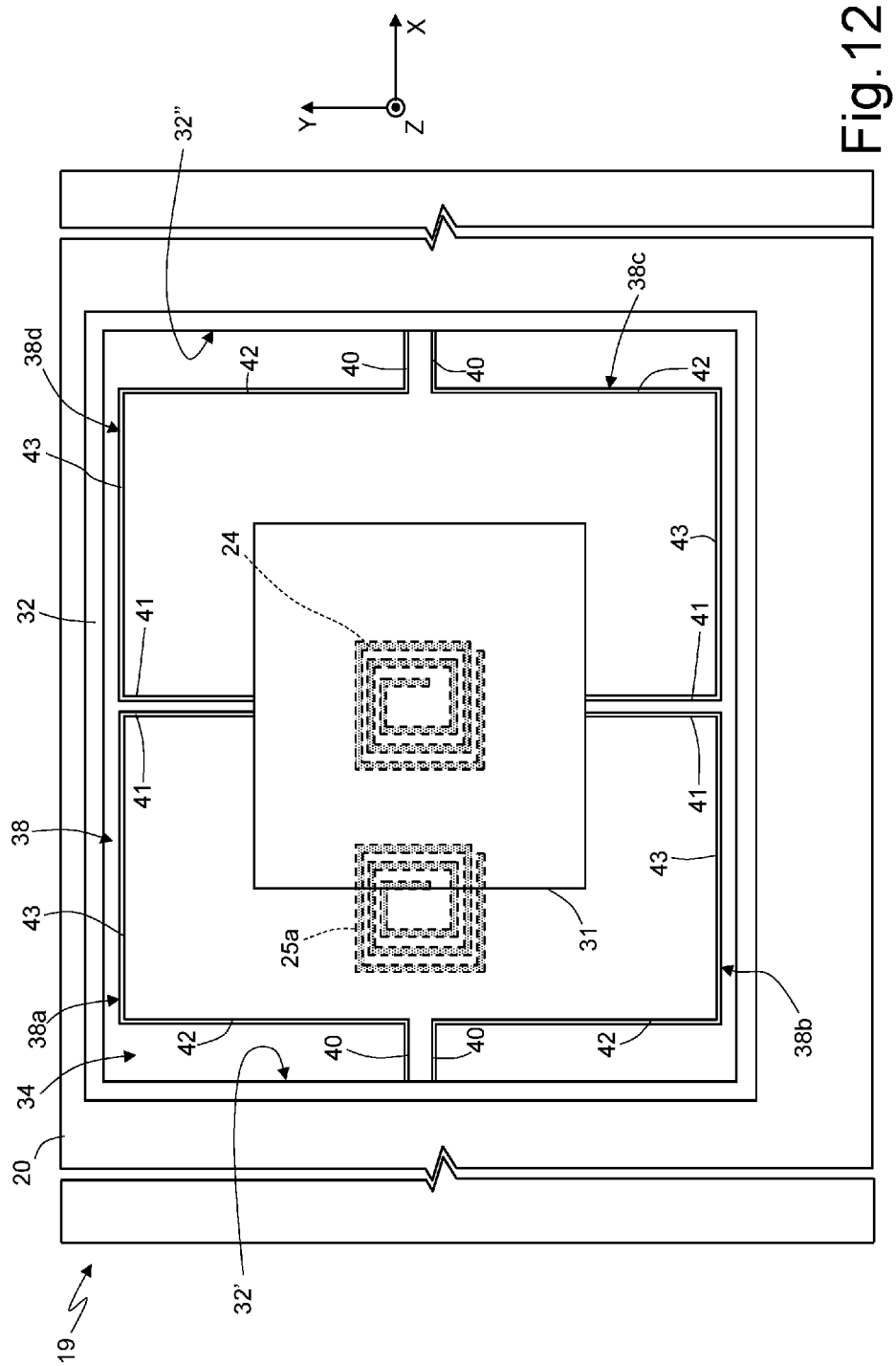
FIGS. 12 and 13 show, in top plan view, respective further embodiments of the inertial sensor according to the present disclosure.

In addition, according to one embodiment of the present disclosure shown in FIG. 12 (in top plan view), the inertial sensor 19 can comprise a single sensing coil (for example, the single sensing coil 25a). In this case, movements of the suspended mass 36 having at least one component along the axis on which the sensing coil is found (e.g., axis X) are detected by analyzing the voltage/current signal induced in the single sensing coil 25a. An increase of the signal value considered (for example, considering the peak-to-peak voltage, an increase of the value $V_{pp,a}$) indicates a movement of the suspended mass along X towards the sensing coil 25a. Instead, a decrease in the signal value considered (for example, considering the peak-to-peak voltage, a decrease of the value $V_{pp,a}$), indicates a movement of the suspended mass along X away from the sensing coil 25a.

Likewise it is possible to measure a value of velocity of movement of the suspended mass 36, exploiting the Doppler effect as described previously, on the basis of the apparent wavelength value associated to the voltage/current signal induced in the sensing coil 25a. The value of acceleration of the suspended mass 36 is moreover obtained.

Figure 13:
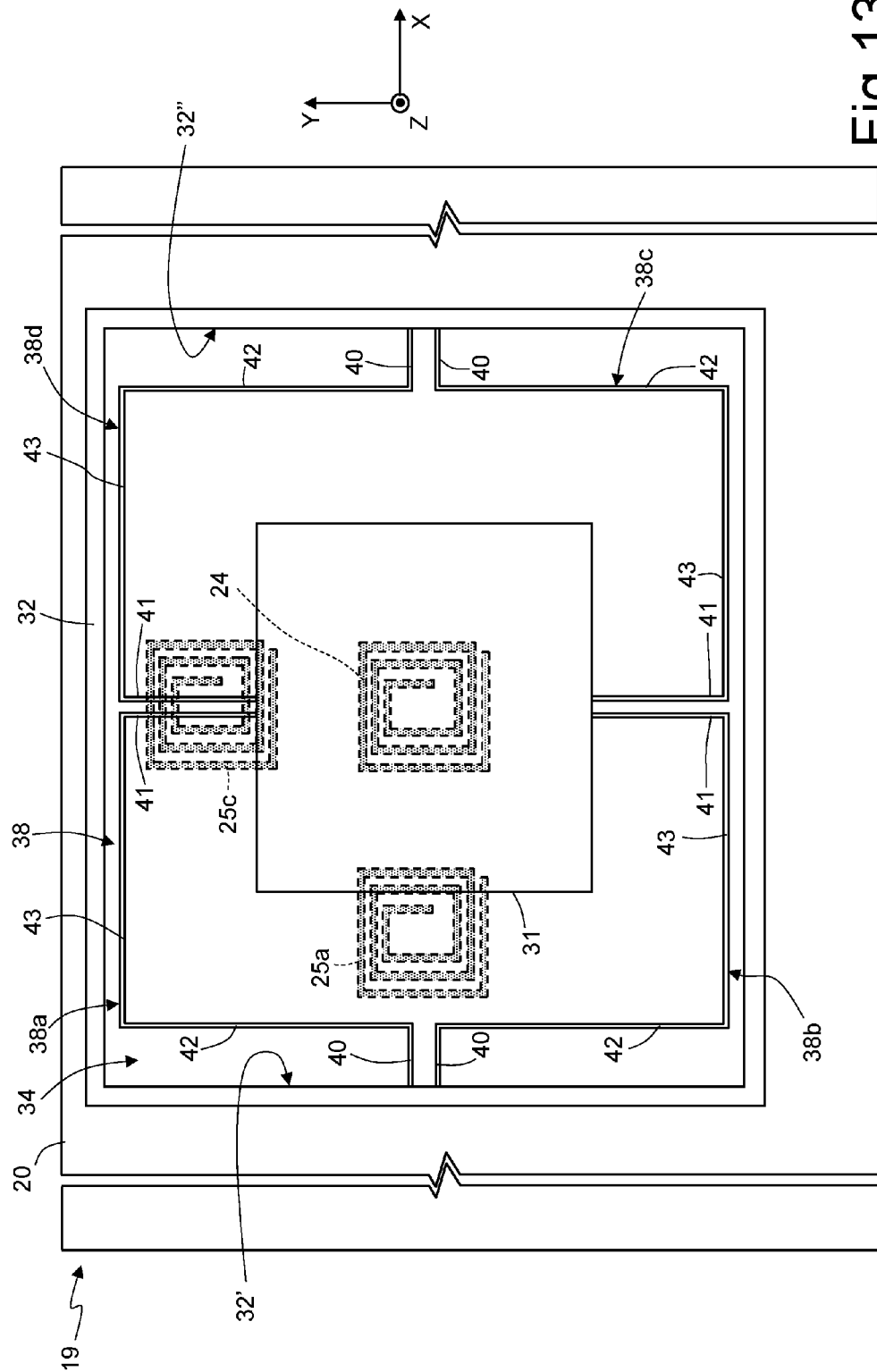

According to a further embodiment, shown in FIG. 13, two sensing coils are present, set along axes orthogonal to one another (for example, one sensing coil along the axis X, for instance, the sensing coil 25a, and one sensing coil along the axis Y, for instance, the sensing coil 25c).

In this way, it is possible to detect biaxial movements, i.e., displacements of the suspended mass 36 having at least one component along the axis X and one along the axis Y.

In greater detail, an increase of the signal value considered (for example, an increase in the peak-to-peak value of the voltage induced in the sensing coil 25a) indicates a movement of the suspended mass along X towards the sensing coil 25a. An increase of the signal value considered (for example, an increase in the peak-to-peak value of the voltage induced in the sensing coil 25c) indicates a movement of the suspended mass along Y towards the sensing coil 25c. Said displacements along X and Y can, obviously, take place simultaneously (i.e., the suspended mass moves with components of motion along both of the axes X and Y). In a way similar to what has been described herein, it is possible to detect displacements of the suspended mass 36 away from the sensing coil 25a and/or from the sensing coil 25c (decrease of the peak-to-peak values).

It is evident that other movements may be detected, for example, an approach of the suspended mass 36 to the sensing coil 25c (increase in the peak-to-peak value of the voltage induced in the sensing coil 25c) and a simultaneous recession of the suspended mass 36 from the sensing coil 25a (decrease in the peak-to-peak value of the voltage induced in the sensing coil 25a), or yet other combinations.

As described previously, also the value of acceleration of the suspended mass 36 moving towards or away from the sensing coil 25a, 25c may be detected (by means of an operation of derivative of the value of velocity—see the foregoing description).

Both for the embodiment of FIG. 12 and for the embodiment of FIG. 13, the movement of the suspended mass 36 can take place exclusively along the axis Z, or along both of the axes X and Z, or along both of the axes Y and Z, or in three dimensions along the axes X, Y and Z.

As an alternative to the amplitude or peak-to-peak value of an electrical parameter, it is possible to consider its root-mean-square value to detect the movement of the suspended mass 36 and its consequent direction, velocity, and acceleration.

According to a further variant of the inertial sensor described, the suspended mass 36, which carries the concentrator layer 39, is not set above the sensing coils, in top plan view. In any case, it is preferable to choose the dimensions and shape of the suspended mass 36 in such a way that, even in the condition of maximum displacement with respect to the resting position, it is at least partially set overlying the excitation coil 24, in top plan view, in such a way as to "receive" the magnetic field generated by the latter.

Numerous variants with respect to what is shown are in any case possible, even in combination with the known art.

For example, it is possible to use different types of signals alternative to the sinusoidal signal used by way of example in the present description, for example, saw-tooth signals, triangular signals, impulsive signals, or yet others.

In addition, the respective geometries of the coils and of the mobile mass are not to be considered limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
   a first device that includes:
      a movable mass;
      a concentrator layer on the movable mass;
   a second device coupled to the first device, the second device includes:
      a substrate;
      an application specific integrated circuit in the substrate;
      a coil support layer on the substrate;
      an excitation coil in the coil support layer;
      a first sensing coil in the coil support layer, the concentrator layer being between the movable mass and the coil support layer; and
      a second sensing coil in the coil support layer, the excitation coil being positioned between the first sensing coil and the second sensing coil.

2. The system of claim 1 wherein the concentrator layer is a magnetic-field concentrator.

3. The system of claim 2 wherein the concentrator layer is aligned horizontally along a planar bottom surface of the movable mass.

4. The system of claim 1 wherein the first device includes a support structure and a plurality of movable arms coupled between the support structure and the movable mass.

5. The system of claim 1 wherein the first device includes a support structure that forms a cavity in which the movable mass is suspended.

6. The system of claim 5 wherein the support structure is in direct contact with the coil support layer of the second device.

7. The system of claim 1 wherein the application specific integrated circuit includes a current generator configured to generate a flow of electric current and to provide the flow of electric current to the excitation coil and a current-sensing circuit configured to detect a value associated with a current induced in the first sensing coil.

8. The system of claim 1 wherein the second device includes a second, third, and fourth sensing coil.

9. The system of claim 8 wherein the excitation coil is between the first and second sensing coil and the excitation coil is between the third and fourth sensing coil.

10. The system of claim 9 wherein the first and second sensing coils are aligned with each other along a first axis and the third and fourth sensing coils are aligned with each other along a second axis that is transverse to the first axis.

11. The system of claim 10 wherein the movable mass is rectangular with a first side substantially parallel to the first axis and a second side substantially parallel to the second axis.

12. The system of claim 10 wherein the movable mass is rectangular where the first axis is diagonal with respect to a first corner and a third corner of the rectangular movable mass and the second axis is diagonal with respect to a second corner and a fourth corner of the rectangular movable mass, the first axis is substantially perpendicular to the second axis.

13. The system of claim 8 wherein the second device includes a fifth, sixth, seventh, and eighth sensing coil, the excitation coil being centrally positioned between the first, second, third, fourth, fifth, sixth, seventh, and eighth sensing coils.

14. A system, comprising:
    a micro-electromechanical device that includes:
       a movable mass;
       a magnetic concentrator layer on the movable mass;
    a substrate, the micro-electromechanical device coupled to the substrate;
       a coil support layer on the substrate, the movable mass being spaced from the coil support layer by a distance;
       an excitation coil in the coil support layer;
       a first sensing coil in the coil support layer, the concentrator layer being between the movable mass and the coil support layer; and
       a second sensing coil in the coil support layer, the excitation coil being positioned between the first sensing coil and the second sensing coil.

15. The system of claim 14 wherein the micro-electromechanical device includes a support structure that is positioned on the coil support layer.

16. The system of claim 15 wherein the micro-electromechanical device includes a plurality of springs positioned between walls of the support structure and the movable mass.

17. The system of claim 14 wherein the movable mass, in a resting position, overlaps portions of the first and second sensing coil.

18. The system of claim 14 wherein the movable mass has a surface having a surface area and the concentrator layer is on the surface and has a substantially similar surface area.

19. A method, comprising:
    coupling a micro-electromechanical device to a substrate;
    suspending a movable mass in the micro-electromechanical device, the movable mass being spaced from the substrate by a distance;
    forming an excitation coil in a coil support layer on the substrate;
    forming a first sensing coil in the coil support layer;
    forming a second sensing coil in the coil support layer, the excitation coil being positioned between the first sensing coil and the second sensing coil; and
    positioning a magnetic concentrator layer that is on the movable mass between the movable mass and the coil support layer.

20. The method of claim 19, further comprising forming a third and fourth sensing coil in the coil support layer.

* * * * *